United States Patent
de Haas

(10) Patent No.: US 11,636,783 B2
(45) Date of Patent: Apr. 25, 2023

(54) ELECTRONIC SHELF LABEL SYSTEM

(71) Applicant: Opticon Sensors Europe B.V., Hoofddorp (NL)

(72) Inventor: Dick de Haas, Hoofddorp (NL)

(73) Assignee: Opticon Sensors Europe B.V., Hoofddorp (NL)

( * ) Notice: Subject to any disclaimer, the term of this patent is extended or adjusted under 35 U.S.C. 154(b) by 323 days.

(21) Appl. No.: 15/849,132

(22) Filed: Dec. 20, 2017

(65) Prior Publication Data

US 2018/0268745 A1   Sep. 20, 2018

Related U.S. Application Data

(60) Provisional application No. 62/439,692, filed on Dec. 28, 2016.

(51) Int. Cl.
| | |
|---|---|
| *G09F 3/20* | (2006.01) |
| *H05K 5/00* | (2006.01) |
| *H05K 7/18* | (2006.01) |
| *H01R 25/14* | (2006.01) |
| *A47F 5/00* | (2006.01) |

(52) U.S. Cl.
CPC .............. *G09F 3/208* (2013.01); *G09F 3/204* (2013.01); *H01R 25/142* (2013.01); *H01R 25/145* (2013.01); *H05K 5/0017* (2013.01); *H05K 7/183* (2013.01); *A47F 5/0043* (2013.01)

(58) Field of Classification Search
CPC ........ A47F 5/0043; G09F 3/204; G09F 3/208; H01R 25/142; H01R 25/145; H05K 5/0017; H05K 7/183

See application file for complete search history.

(56) References Cited

U.S. PATENT DOCUMENTS

| | | | | |
|---|---|---|---|---|
| 5,348,485 A | * | 9/1994 | Briechle | H01R 25/14 439/110 |
| 6,126,125 A | * | 10/2000 | Dalton | G09F 3/204 248/205.2 |
| 6,142,322 A | * | 11/2000 | Smith | A47F 5/0869 211/183 |
| 2008/0119291 A1 | * | 5/2008 | Takamoto | A63F 13/02 463/47 |
| 2010/0031548 A1 | * | 2/2010 | Lee | G09F 3/204 40/655 |
| 2012/0044056 A1 | * | 2/2012 | Byun | G06Q 30/0641 340/10.1 |

(Continued)

FOREIGN PATENT DOCUMENTS

| | | | | |
|---|---|---|---|---|
| JP | 2001312221 A | * | 11/2001 | ............. G09F 3/204 |
| JP | 3614083 B2 | * | 1/2005 | ............. G09F 3/204 |

*Primary Examiner* — Yong Hang Jiang

(74) *Attorney, Agent, or Firm* — Kaplan Breyer Schwarz, LLP

(57) ABSTRACT

An electronic shelf label system includes a powered rail for holding electronic shelf labels. The front side of the rail includes a recess that is physically configured to receive a protrusion at the upper rear side of the shelf label. The shelf label further comprises a lower hook member for engaging with a lower edge of the rail. The rail may comprise two conductors for providing the labels with power and data for display on the label. Data and power may be provided via a controller and power module connected to the back of the rail.

17 Claims, 5 Drawing Sheets

(56) References Cited

U.S. PATENT DOCUMENTS

| | | | |
|---|---|---|---|
| 2012/0060399 A1* | 3/2012 | Sjodln | G09F 3/208 40/655 |
| 2016/0027348 A1* | 1/2016 | Joliey | A47F 5/0068 40/5 |
| 2016/0048798 A1* | 2/2016 | Meyer | G06Q 10/087 705/28 |
| 2016/0063901 A1* | 3/2016 | Joliey | G09F 3/204 40/5 |

* cited by examiner

ELECTRONIC SHELF LABEL SYSTEM

STATEMENT OF RELATED CASES

This case claims priority of U.S. Pat. Appl. Ser. No. 62/439,692, filed Dec. 28, 2016 and which is incorporated herein by reference.

FIELD OF THE INVENTION

The present invention relates generally to shelf label systems and more particularly to electronic shelf label systems.

BACKGROUND OF THE INVENTION

Shelf label systems and electronic shelf label systems in particular require proper fixation of the shelf labels to the shelf, for example by means of a rail. Shelf labels are to be mounted on the rail in a convenient and efficient way. On the other hand, they should be well attached so that unauthorized removal of the shelf labels is difficult.

SUMMARY OF THE INVENTION

It is preferred to provide a rail for holding shelf labels and a shelf label compatible with the rail as part of a shelf label system in which labels are well secured.

A first aspect provides a rail for holding a shelf label. The rail comprises an elongated body having a substantially flat front surface and an elongated top member having a lower surface, the top member being connected to the body such that the top member protrudes from the front surface and the lower surface is provided substantially perpendicularly to the front surface. The body comprises a front recess in the front surface, the front recess being at an upper side delimited by the top member.

This rail provides a convenient look with a substantially flat front. The label is held by the protrusion at the top, under the top member. This top member at least partially hides the recess from being viewed, which enhances the looks of the rail, while providing security.

An embodiment of the rail comprises a top protrusion protruding substantially perpendicularly from the lower surface. Such top protrusion may be received by a recess at the top of a label, which enhances fixation of the label relative to the rail.

In a further embodiment of the rail, the recess is at the lower front side delimited by a ridge that is substantially flush with the front surface. The ridge may be received by an opening at a bottom side of a protrusion provided at the top of the rear of a label. Such protrusion may be provided as a hook. This enhances fixation of the label relative to the rail.

Another embodiment of the rail comprises a first conductor and a second conductor provided substantially parallel to one another along the length of the rail. These electrodes may be used for providing electrical energy to labels mounted on the rail. Furthermore, the same electrodes may be used for communicating control signals between the labels and a control unit.

In yet a further embodiment, the first conductor and the second conductor are embedded in the body such that they do not extend beyond the front surface. With this embodiment, the risk of short circuit between the conductors is reduced. Furthermore, it provides a more pleasant view.

In again another embodiment, the body further comprises an elongated first conductor cavity provided along the length of the body for housing the first conductor; and an elongated second conductor cavity provided along the length of the body for housing the second conductor. The cavity is narrower at the front surface than at a distance from the front surface. In this embodiment, auxiliary devices like a controller and a power pack, like a battery pack or a transformer from mains may be connected to the rail.

A further embodiment comprises a rear surface opposite to the front surface, wherein a wall of the first conductor cavity and a wall of the second conductor cavity protrude from the rear surface. The body further comprises a rear connector arranged to engage with an accessory connector comprised by an auxiliary device, the rear connector being provided at the rear surface and comprising a connector cavity having an opening at the rear side, wherein and the connector cavity is provided between the first conductor cavity and the second conductor cavity.

This embodiment requires a relatively low amount of material, as the walls of the conductor recesses provide two functions.

A second aspect provides an electronic shelf label for displaying information. The shelf label comprises a label body having a front side for displaying information, a rear side opposite to the front side and a top side at the top of the label, a lower hook member protruding from a lower portion of the rear side having an upwardly facing opening for receiving a lower edge of a rail for holding the shelf label; and a rear protrusion protruding from the top of the rear side having a closed upper side substantially flush with an upper side of the label.

With the protrusion arranged to be received by a recess in a rail arranged for receiving the label and the hook provided around the lower edge of the rail, the label may be well secured on the rail.

An embodiment of the label comprises a recess at the top side for receiving a protrusion comprised by the rail. With the protrusion received by the recess, the label is even better secured to the rail.

In another embodiment of the label, the protrusion comprises an upper hook member having a downwardly facing opening for receiving a ridge. With the hook provides around a ridge in the recess in the rail receiving the protrusion of the label, the label is even better secured to the rail.

A third aspect provides a controller module for controlling at least one electronic shelf label provided on a rail for holding the electronic shelf label. The controller module comprises a housing for housing control electronics for controlling the electronic shelf label, and a controller connector arranged to engage with the rear connector of embodiments of the first aspect comprising such connector.

A fourth aspect provides an electronic shelf label system comprising the rail according to the first aspect, the label according to the second aspect and the controller module according to the third aspect.

DETAILED DESCRIPTION

Figure 1A:
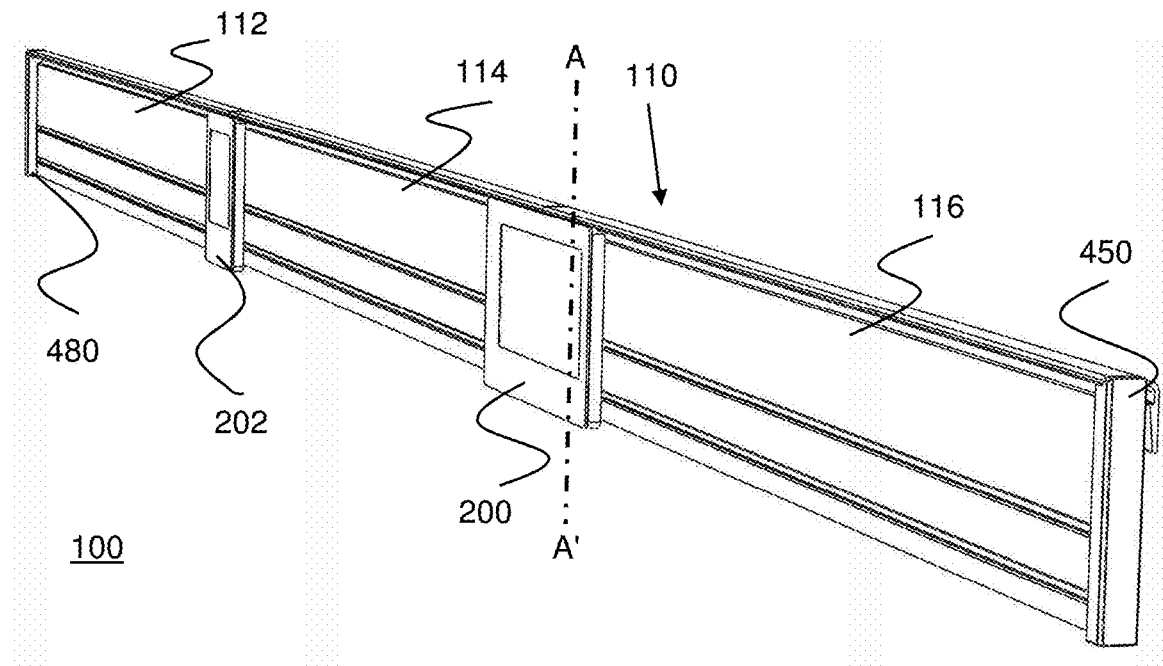
FIG. 1A depicts a front side of an electronic shelf label system in accordance with the illustrative embodiment.

FIG. 1A depicts a shelf label system 100 for providing information on articles placed on a shelf in, for example, a shop. The shelf label system 100 comprises a rail system 110 comprising a first rail segment 112, a second rail segment 114 and a third rail segment 116. In this embodiment, all rails segments are substantially the same. In other embodiments, the rail segments at the ends of the rail system 110 are different. This may be advantageous for closing off the rail system to prevent unwanted removal of objects provided on the rail system 110. In the embodiment shown by FIG. 1A, the rail system 110 is closed by means of a first end cap 450 and a second end cap 480. On the rail system 110, a first electronic shopping label 200 and a second electronic shopping label 202 are provided.

Figure 1B:
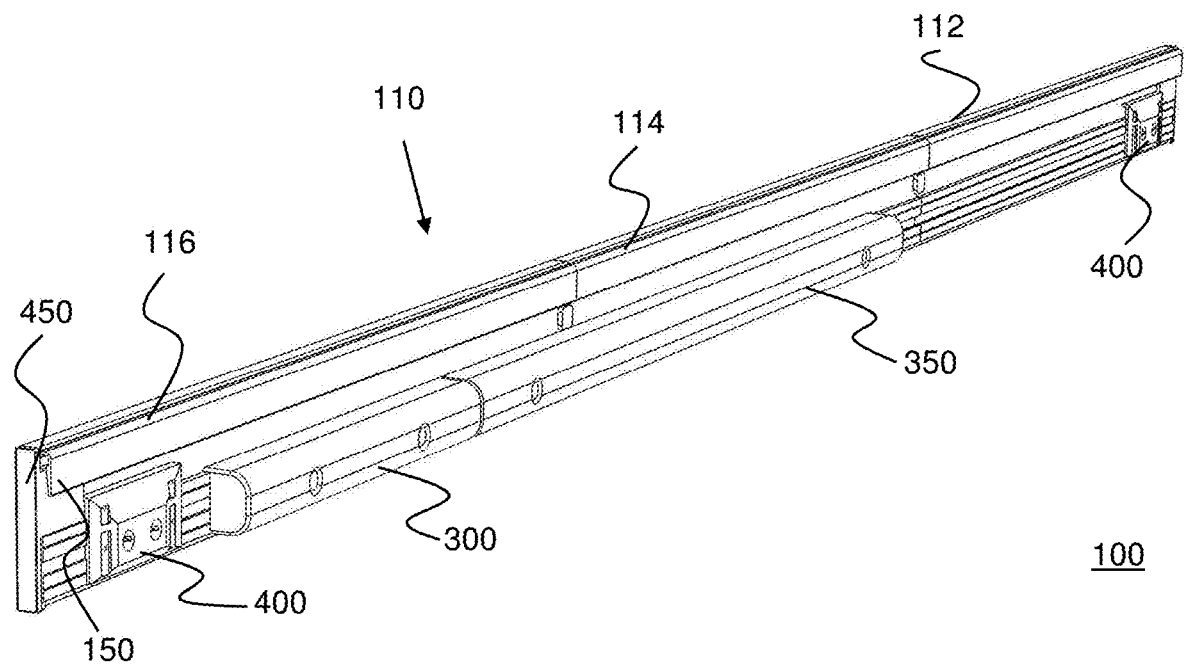
FIG. 1B depicts a rear side of an electronic shelf label system.

FIG. 1B depicts the back of the shelf label system 100. In addition to the rail system 110 with the first rail segment 112, the second rail segment 114 and the third rail segment 116, FIG. 2 also depicts a controller module 300 and a battery module 350. In the embodiments discussed below, the controller module 300 and the electronic shelf labels are provided with electrical energy from batteries provided in the battery module 350. The various aspects may also be embodied as receiving power from a mains power supply, either directly or via a transformer.

In addition to the first end cap 450 and the second end cap 480, FIG. 1B also depicts two cap locking modules 400. In this embodiment, the shelf label system 100 is provided with two identical cap locking modules 400. In other embodiments, different cap locking modules 400 are provided for each side of the rail system 110. And FIG. 1B depicts a clip 150 as a shelf connector for connecting the rail system 110 to a shelf of a gondola in a supermarket or other shop. The shelf connector may be embodied in various ways, as also shelves of gondolas are manufactured in different ways, by different manufacturers.

Figure 2:
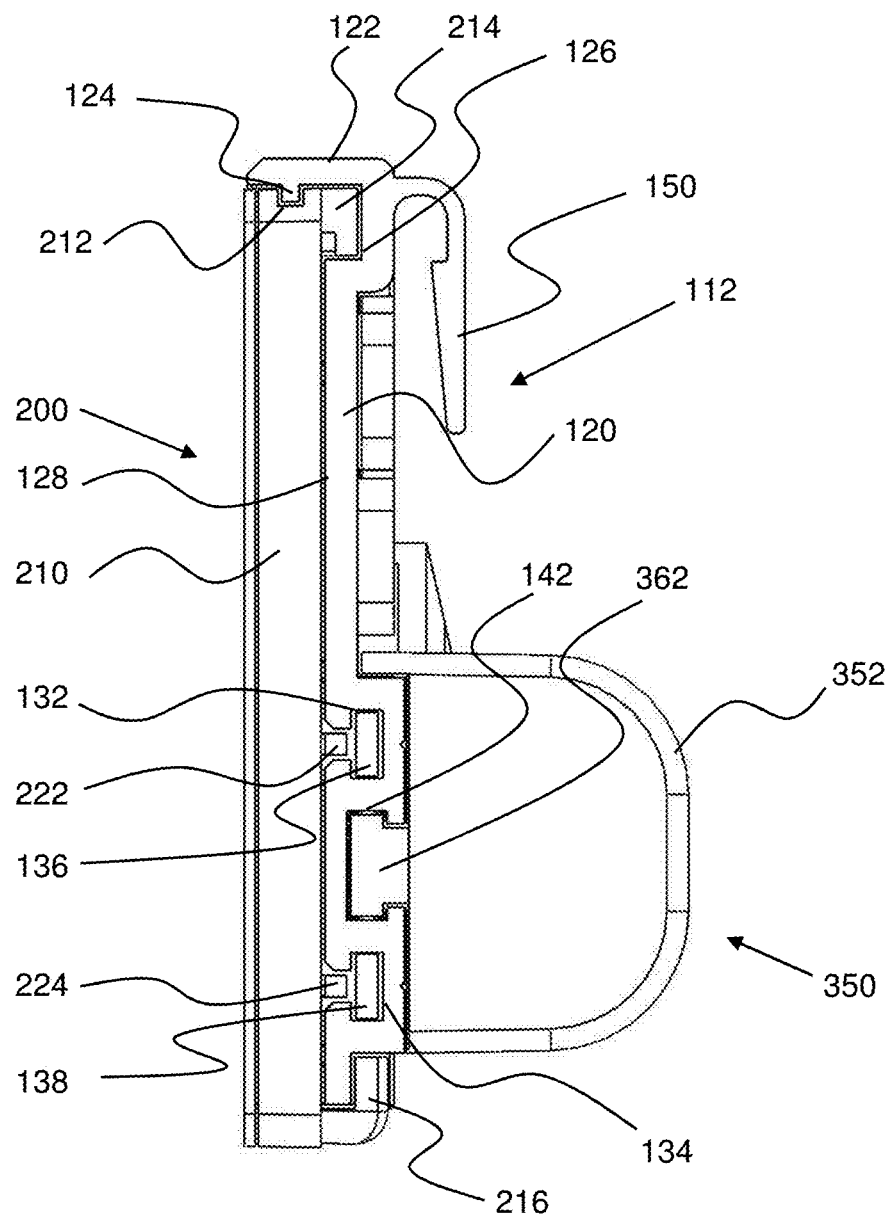
FIG. 2 depicts a cross-section of an electronic shelf label system.

FIG. 2 depicts a cross-section of the shelf label system 100. The cross-section is provided at a location where the battery module 350 is connected to the first rail segment 112 of the rail system 110. This location is in FIG. 1A indicated by the line A-A'. FIG. 2 depicts the first rail segment 112 comprising a rail segment body 120. At the top of the rail segment body, a rail top member 122 is provided. The bottom surface of the rail top member 122 is provided substantially perpendicularly to the front surface 128 of the rail segment body 120.

From the rail top member 122, a top protrusion 124 protrudes downwardly, i.e., in the direction of the rail segment body. The top protrusion 124 is, in this embodiment, provided such that it is parallel to the front surface 128 and provided in a virtual plane that is at a distance from the front surface 128.

Between the rail top member 122 and the front surface 128, a top recess 126 is provided. In this embodiment, the top recess 126 has a substantially perpendicular shape. In another embodiment, the top recess 126 may be partially closed by a top ridge. The top ridge may extend from the front surface 128 or protrude from the rail top member 122. It is preferred a front side of the top ridge is substantially flush with the front surface 128.

Additionally or alternatively, a further top ridge is provided for closing off the top recess 126, which further top ridge extends from the lower edge of the top recess 126. With one or both of the top ridge and the further top ridge partially closing off the top recess, the top protrusion 124 may be omitted if the top ridge and the further top ridge provide sufficient security in holding shelf labels mounted to the rail system 110.

In the rail segment body, a first conductor 136 is provided in a first conductor recess 132 and a second conductor 138 is provided in a second conductor recess 134, the recesses being provided in the front surface 128. In this embodiment, the conductors are provided in a recessed way, i.e. the front side of the conductors is recessed relative to the front surface 128.

The conductor recesses are partially enclosed, at the bottom and at the top, for holding the conductors. Alternative embodiments may be envisaged, in which the front side of the conductors is flush with the front surface 128 and/or in which the conductor recesses are not partially cover and the full front surface of the conductors is exposed. Further means for attaching the conductors to the rail segment body may be provided, like glue or other substances. This is particularly advantageous if the conductors not being partially covered as shown by FIG. 2.

FIG. 2 also depicts a cross-section of the first electronic shopping label 200. The first electronic shopping label 200 comprises a housing 210 for housing the various parts of the electronic shopping label 200, including a display screen and electronics. At the top of the housing 210, a top housing recess 212 is provided. The top housing recess 212 is arranged to receive the top protrusion 124 of the first rail segment 112.

At the top of the housing 210, at the back, a top hook member 214 is provided. The top hook member 214 is arranged to be received by the top recess 126. The opening of the top hook member 214 is at the bottom, facing downward. This allows the opening of the top hook member 214 to receive the optional top ridge as discussed above. If the top recess 126 is not provided with the top ridge, the hook member 214 may be replaced by a non-open protrusion that is arranged to be received by the top recess 126.

At the bottom of the housing 210, a lower hook member 216 is provided at the back of the housing 210. An opening of the lower hook member 216 faces upward for receiving a bottom edge of the rail segment body 120. In this embodiment, the lower hook member 216 extends such that the end of the lower hook member abuts the protrusion of the second conductor recess 134.

The rail system 110 is arranged for supporting electronic shelf labels of various sizes. With an electronic shelf label being higher than the electronic shelf label 200 as depicted by FIG. 2, the lower hook member 216 is not provided at the bottom of the housing of the larger shelf label, but, for example, in the middle. Yet, the lower hook member 216 is preferably provided at a distance from the top of the housing that is substantially the same as with the embodiment depicted by FIG. 2. This allows also the larger label to be received and held by the rail system 110.

At the back of the housing 210, a first electrode 222 and a second electrode 224 are provided, the two electrodes are provided at a position relative to another and relative to the top of the housing 210 such that if the top hook member 214 is received by the top recess 126, the first electrode 222 is in contact with the first conductor 136 and the second electrode 224 is in contact with the second conductor 138. If the conductors are recessed relative to the front surface 128, the electrodes are provided at a length such that they abut to the electrodes. In a preferred embodiment, the electrodes are provided at a length such that when the first electronic shelf label 200 is connected to the rail system 110, the electrodes abut to the conductors at a particular bias. To this end, the electrodes may be spring loaded, with a biasing force pushing the electrodes outwardly from the housing 210.

The electrodes are preferably sized such that they are not higher than the height of the conductors. If the conductors are partially covered, as shown by FIG. 2, the electrodes are sizes such that they fit between the two ridges partially covering the conductors. It is noted that the width—or lengths—of the conductors extends along the rail system 110 or in any case along the length of the first rail segment 112. This allows the electrodes to extend perpendicularly to the plane of the drawing provided by FIG. 2. Alternatively or additionally, additional electrodes are provided. In such embodiment, the first electronic shopping label 200 comprises a third electrode connected to the first electrode 222 and provided at a position to contact the first conductor 136 as well. And the second electronic shopping label 200 comprises a fourth electrode connected to the second electrode 224 and provided at a position to contact the second conductor 138 as well.

At the back of the rail segment body 120, a connector cavity 142 is provided as an accessory connector. The connector cavity 142 is provided between the first conductor recess 132 and the second conductor recess 134. The connector cavity 142 is partially closed at the upper and lower side of the connector cavity. This allows a mating connector of an accessory to engage with the connector cavity 142 as an accessory connector in a secure way.

FIG. 2 depicts the battery module 350 connected to the rail system 110 by means of the connector cavity 142 and a rail connector protrusion 362. The rail connector protrusion 362 is connected to a battery housing 352 of the battery module 350. In this way, the rail connector protrusion 362 is provided as a rail connector arranged to engage with the accessory connector comprised by the rail system 110.

As indicated, the drawing depicted by FIG. 2 depicts a cross-section of the shelf label system 100 as shown by FIG. 1A and FIG. 1B. These Figures show the rail segments as elongated bodies. Also the various elements of the rail segments, discussed in detail above, extend in longitudinal direction of the rail segments. This may apply in particular to one, multiple or all of the rail segment body 120, the rail top member 124, the top recess 126, the top protrusion 128, the top ridge, the further top ridge, the first conductor recess 132, the second conductor recess 134, the first conductor 136 and the second conductor 138.

These elements may be provided in a continuous way or they may be provided intermittently. As an example, the top protrusion 124 may be provided either as a long strip, protruding from the rail top member 122, or as a series of protrusions along the rail top member 122.

Providing the various elements of the rail system 110 in a longitudinally continuous way allows the electronic shelf labels, the controller module 300 and the battery module 350 to be slid onto the rail system 110. By virtue of the various recesses and protrusions as connecting elements that engage with one another, the electronic shelf labels, the controller module 300 and the battery module 350 cannot be removed from the rail system 110 other than sliding them off the rail. Hence, if the rail system 110 is closed at the sides, by means of the first end cap 450 and the second end cap 480, these accessories are secured. Because electronic shelf labels may needs to be replaced once in a while, for example for temporarily providing larger labels for promotions, the end caps need to be removed without too much burden. On the other hand, the end caps need to be well secured to make theft not too easy.

FIG. 1B depicts the cap locking modules 400. The cap locking modules 400 lock the first end cap 450 and the second end cap 480 to the rail system 110.

Figure 3A:
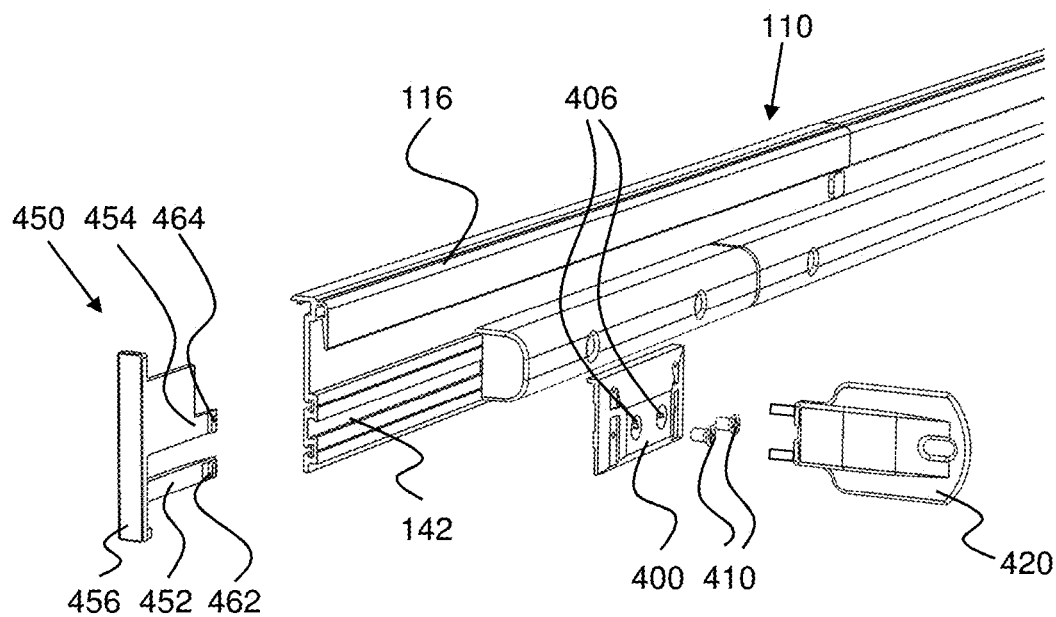
FIG. 3A depicts a side of an electronic shelf label system with unmounted cap locking module.
Figure 3:
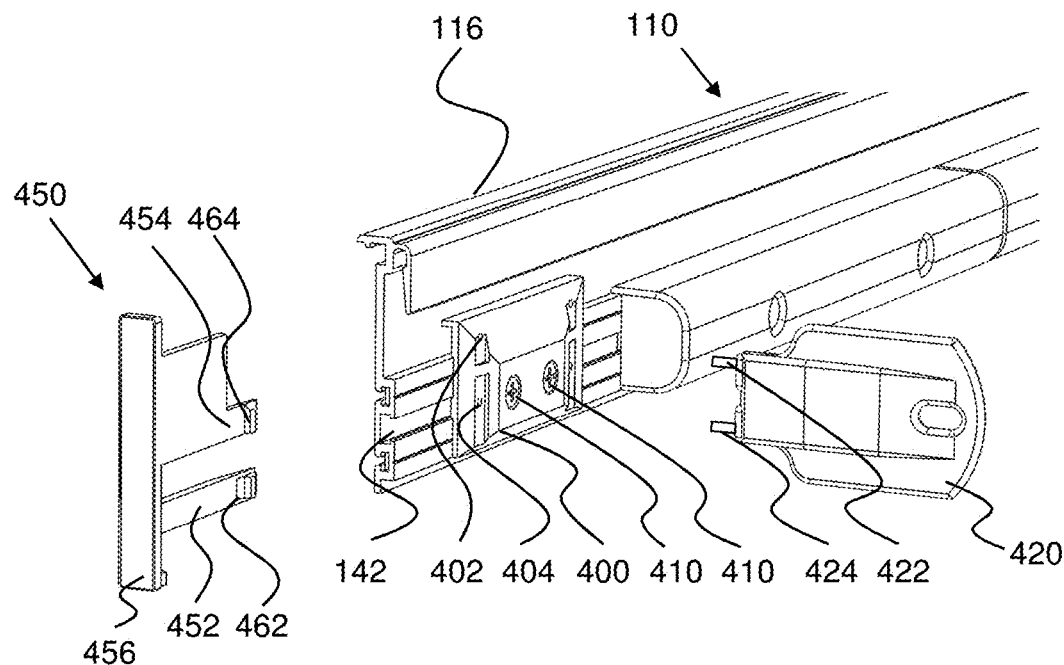
FIG. 3B depicts a side of an electronic shelf label system with mounted cap locking module.
FIG. 3C depicts a side of an electronic shelf label system with mounted end caps.
FIG. 3D depicts a cross-section of an end of an electronic shelf label system.

FIG. 3A depicts the first end cap 450 and the cap locking module 400 in further detail. Furthermore, FIG. 3A depicts a key 420 of which functionality will be discussed further below.

The first end cap 450 comprises a first cap lip 452 and a second cap lip 454 that are both connected to a first cap end 456 at proximal ends of the cap lips. At a distal end of the first cap lip 452, a first cap cam 464 is provided and at a distal end of the second cap lip 454, a second cap cam 464 is provided. The first cap lip 452 has a width that substantially matches the width of the connector cavity 142. This allows the first cap lip 452 to be received by the connector cavity 142.

The first cap lip 452 is provided on the first cap end 456 such that if the first cap lip 452 is received by the connector cavity 142, the first cap end 456 covers at least most of the side of the rail system 110. Preferably, all of the side of the rail system 110 is covered. Furthermore, the proximal end of the second cap lip 454 is connected to the first cap end 456 such that the second cap lip 454 fits above the protrusion of the first conductor recess 132.

The cap locking module 400 may be connected to the rail system 110 by means of two plugs 410. The two plugs 410 may be threaded and/or provided with parallelly provided circular protrusions around the plugs 410. Alternatively or additionally, the plugs 410 are provided with barbs or other protrusions. The plugs 410 preferably comprise a resilient material or are completely provided in a resilient material.

The cap locking module 400 is placed at the back of the rail system 110 as shown by FIG. 3B. Subsequently, the plugs 410 are provided in holes 406 provided in the cap locking module 400. The holes 406 are located in the cap locking module 400 such that they coincide with the connector cavity 142. This allows the connector cavity 142 to receive the plugs. Alternatively or additionally, dedicated openings are provided in the third rail segment for receiving, holding and securing the plugs 410.

An embodiment wherein the connector cavity 142 comprises ridges at the top and at the bottom is preferred. This is because the ridges may act as an inner thread for engaging with an outer thread of the plugs 410. The thread, circular protrusions, barbs and/or other protrusions give way to the ridges at the entrance of the connector cavity as the plugs 410 are inserted in the connector cavity. Due to the preferred resilient nature of the plugs 410, the protrusions are set back to their original shape and position. And if the plugs 140 are provided with concentric rings rather than a thread, the ridges make removal of the plugs at least more difficult.

Once the cap locking module 400 is provided at its proper place as depicted by FIG. 3B, the first end cap 450 is snap-fit locked in the cap locking module 400 by means of the first cap lip 452 and the second cap lip 454. The cap lips engage with the rail system 110 as discussed above, in particular the second cap lip engages with the connector cavity 142. This situation is depicted by FIG. 3C.

Figure 3C:
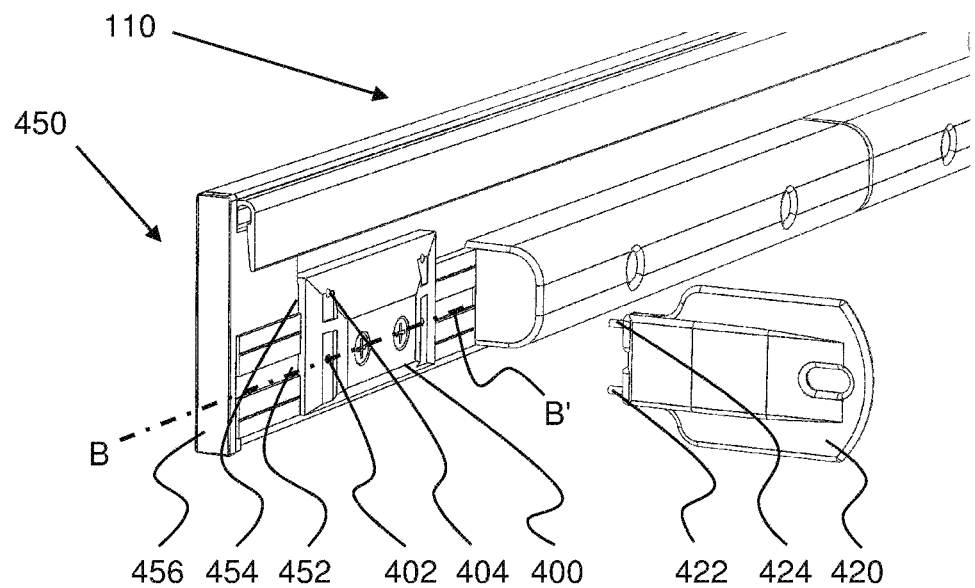
Figure 3D:
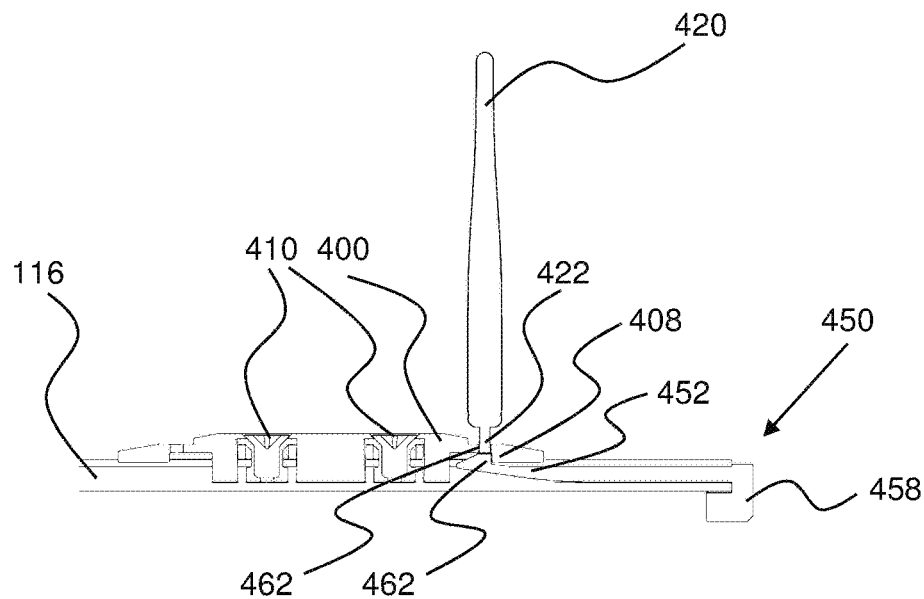

FIG. 3D depicts a cross-section of the rail system 110 with the cap locking module 400 and the first end cap 450 at the line B-B' indicated in FIG. 3C. FIG. 3D depicts how the first end cap 450 is locked by the cap locking module 400 and how the first end cap 450 may be released by means of the key 420.

The first end cap 450 is locked by the cap locking module 400 as the first cap cam 462 abuts to a first locking abutment 408 comprised by the cap locking module 400. With the first cap cam 462 abutting to the first locking abutment 408, the first end cap 450 cannot be removed from the third rail segment 116 comprised by the rail system 110—at least not without damage to the first end cap or the cap locking module 400, or both.

For unlocking, the cap locking module 400 is provided with a first unlocking hole 402 and a second unlocking hole 404. The first unlocking hole 402 is provided at the location where the first cap cam 462 is provided when resting against the first locking abutment 408. The second unlocking hole 404 is provided at a location where the second cap cam 464 is resting against an abutment comprised by the cap locking module 400. For unlocking, the key 420 engages with the locking cap module 400.

More in particular, a first key pin 422 is stuck in the first unlocking hole 402 and a second key pin 424 is stuck in the second unlocking hole 440. The key pins push the cap cams beyond the reach of the locking abutments. This is enabled by virtue of the resilient nature of the cap lips, that may, for example, be provided by a choice of a resilient material. Once the cap cams are pushed beyond the locking abutments, the first end cap 450 may be removed from the third rail segment 116 by sliding it off the third rail segment 116.

In addition to what is discussed above, FIG. 3D also discloses an end hook 458 comprised by the first end cap 450. The end hook 458 covers an end of the third rail segment 116 and with that, an end of the rail system 110. This provides protection against potentially sharp edges of the end of the third rail segment 116.

As discussed above, the controller module 300 for controlling the electronic shelf labels and a battery module 350 for providing electrical energy to the controller module 300 and the electronic shelf labels. For providing electrical contact between the controller module 300, the battery module 350 and the electronic shelf labels, firstly the first conductor 136 and the second conductor 138 are provided. These two conductors may in contact with the electronic shelf labels via the first electrode 222 and the second electrode 224. And the two conductors may be in contact with the controller module 300 and the battery module 350 through various means.

In one embodiment, electrical connections are provided through the connector cavity 142 and the rail connector protrusion 362 through the connection between the accessory connector and the rail connector, when both are engaged. In another embodiment, electrical connections are provided via the first end cap 450. To that purpose, the first end 450 may further be provided with electrical contacts that contact the controller module 300 and/or the battery module 350. These electrical contacts may be provided along and/or in extension of the cap lips at one side and along the end hook 458. With electrical contacts provided within the end hook 458, an electrical connection between the rear side of the rail segment body 120 and the front side of the rail segment body 120 may be provided.

Figure 4:
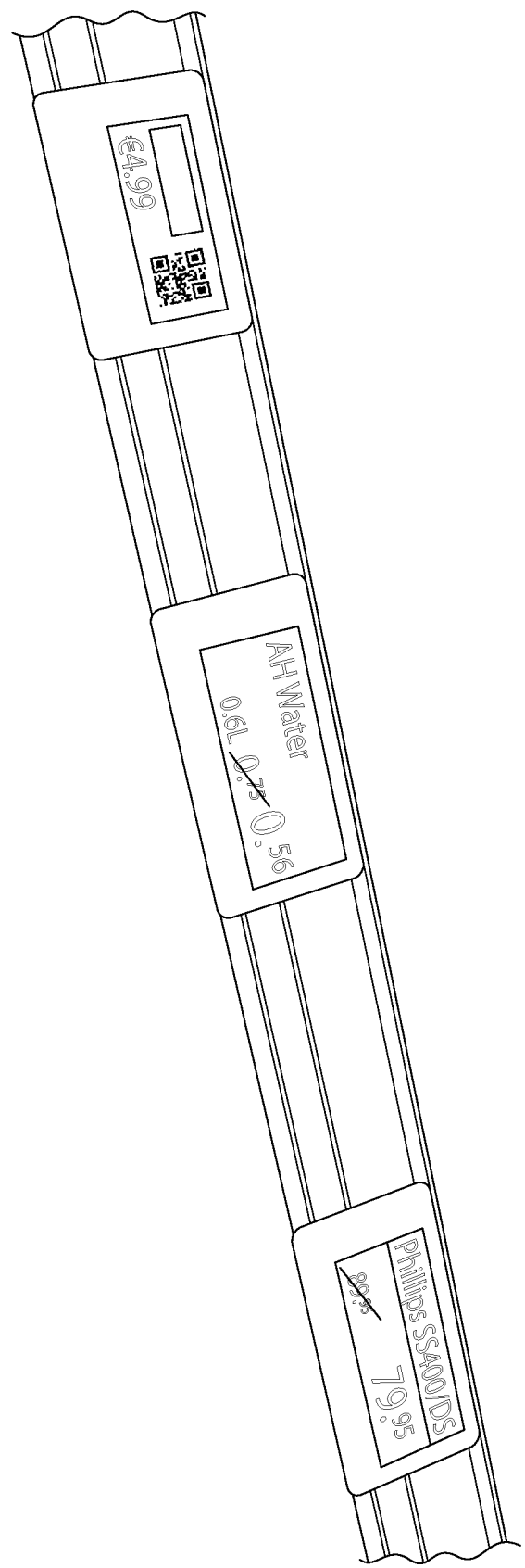
FIG. 4 depicts an embodiment of the shelf label system of FIG. 1A, wherein three electronic shopping labels are coupled to the rail system.

FIG. 4 depicts an embodiment of a system 100 of FIG. 1A wherein three electronic shopping labels are physically and electronically coupled to the railing system.

Expressions such as "comprise", "include", "incorporate", "contain", "is" and "have" are to be construed in a non-exclusive manner when interpreting the description and its associated claims, namely construed to allow for other items or components which are not explicitly defined also to be present. Reference to the singular is also to be construed in be a reference to the plural and vice versa.

In the description above, it will be understood that when an element such as layer, region or substrate is referred to as being "on" or "onto" another element, the element is either directly on the other element, or intervening elements may also be present.

Furthermore, the invention may also be embodied with less components than provided in the embodiments described here, wherein one component carries out multiple functions. Just as well may the invention be embodied using more elements than depicted in the Figures, wherein functions carried out by one component in the embodiment provided are distributed over multiple components.

A person skilled in the art will readily appreciate that various parameters disclosed in the description may be modified and that various embodiments disclosed and/or claimed may be combined without departing from the scope of the invention.

In summary, the various aspects relate to a rail for holding electronic shelf labels having a housing matching the shape of the front side of the rail. A rail comprises a recess at the front side arranged for receiving a protrusion at the upper rear side of the label. The rail comprises an upper ledge, of which a lower surface is provided perpendicular to the front side of the rail. Either the lower surface or the front of the protrusion comprises a ridge that may be received by a recess comprised by the label, at applicable locations. The label further comprises a lower hook member for engaging with a lower edge of the rail. The rail may comprise two conductors for providing the labels with power and data for display on the label. Data and power may be provided via a controller and power module connected to the back of the rail.

What is claimed:

1. A rail for holding a shelf label, the rail having a front side and a rear side, the rail comprising:
    an elongated body having a substantially flat front surface;
    an elongated top member having a lower surface, the top member being connected to the body such that the top member protrudes horizontally from the front surface away from the rear side and the lower surface is provided substantially perpendicularly to the front surface, and the top member further having a top protrusion protruding downwardly and substantially perpendicularly from the lower surface, the top protrusion for receipt by a recess at the top of the label; and
    a first conductor and a second conductor provided substantially parallel to one another along the length of the rail and being embedded in the elongated body such that they do not extend beyond the front surface,
    wherein the elongated body comprises a front recess in the front surface, the front recess being at an upper side delimited by the top member.

2. The rail according to claim 1, wherein the front recess further includes a ridge that is substantially flush with the front surface.

3. The rail according to claim 1, the body further comprising:
    an elongated first conductor cavity provided along the length of the body for housing the first conductor; and
    an elongated second conductor cavity provided along the length of the body for housing the second conductor, wherein the first and second conductor cavities being narrower at the front surface than at a distance from the front surface.

4. The rail according to claim 1, further comprising a rear connector provided at a rear surface opposite to the front surface, the rear connector being arranged to engage with an accessory connector comprised by an auxiliary device.

5. The rail according to 6, further comprising a rear surface opposite to the front surface, wherein a wall of the first conductor cavity and a wall of the second conductor cavity protrude from the rear surface;
the body further comprising a rear connector arranged to engage with an accessory connector comprised by an auxiliary device, the rear connector being provided at the rear surface and comprising a connector cavity having an opening at the rear side, wherein and the connector cavity is provided between the first conductor cavity and the second conductor cavity.

6. The rail according to claim 5, further comprising:
a first electrical connection between the first conductor and a first electrical connector for providing a first electrical connection to the auxiliary device; and
a second electrical connection between the second conductor and a second electrical connector for providing a second electrical connection to the auxiliary device.

7. The rail according to claim 1, further comprising a shelf connector configured to connect the rail to a shelf for displaying products in a shop.

8. An electronic shelf label for displaying information, the shelf label comprising:
a label body having a front side for displaying information, a rear side opposite to the front side and a top side at the top of the label body;
a lower hook member protruding from a lower portion of the rear side having an upwardly facing opening configured to receive a lower edge of a rail for holding the electronic shelf label, the rail for fixation to a shelf; and
a rear protrusion protruding from the top of the rear side having a closed upper side substantially flush with an upper side of the label body.

9. The electronic shelf label according to claim 8, further comprising a recess at the top side configured to receive a protrusion comprised by the rail.

10. The electronic shelf label according to claim 8, wherein the rear protrusion comprises an upper hook member having a downwardly facing opening configured to receive a ridge of the rail.

11. The electronic shelf label according to claim 8, further comprising:
a first electric contact configured to receive electrical energy from a first conductor of the rail; and
a second electric contact configured to receive electrical energy from a second conductor of the rail.

12. The electronic shelf label according to claim 11, further comprising:
a third electric contact configured to receive electrical energy from the first conductor of the rail; and
a fourth electric contact configured to receive electrical energy from the second conductor of the rail.

13. The electronic shelf label according to claim 8, further comprising a communication unit for receiving information for display, an electronic display for displaying the information and a display driver for transforming data received to a format the electronic display is arranged to display.

14. A rail for holding at least one shelf label, and a controller module for controlling the at least one shelf label, the rail, the rail having a front side and a rear side, the rail comprising:
an elongated body having a substantially flat front surface;
an elongated top member having a lower surface, the top member being connected to the body such that the top member protrudes horizontally from the front surface away from the rear side and the lower surface is provided substantially perpendicularly to the front surface, and the top member further having a top protrusion protruding downwardly and substantially perpendicularly from the lower surface, the top protrusion for receipt by a recess at the top of the label;
the controller module for controlling at least one electronic shelf label provided on the rail for holding the at least one_electronic shelf label, the controller comprising:
a housing for housing control electronics configured to control the electronic shelf label; and
a controller connector comprising a protrusion protruding from the controller module and being wider at a distance from the controller module, the protrusion comprising at least a first controller electrode and a second controller electrode, the controller connector arranged to engage with a rear connector cavity of the rail.

15. The controller module according to claim 14, wherein the at least the first controller electrode being configured to connect the control electronics to a first electrical connection and the second controller electrode being configured to connect the control electronics to a second electrical connection.

16. An electronic shelf label system comprising:
(a) a rail having a front side and a rear side, the rail comprising:
an elongated body having a substantially flat front surface;
an elongated top member having a lower surface, the top member being connected to the body such that the top member protrudes horizontally from the front surface away from the rear side and the lower surface is provided substantially perpendicularly to the front surface; and the top member further having a top protrusion protruding downwardly and substantially perpendicularly from the lower surface, the top protrusion for receipt by a recess at the top of the label; and
a first conductor and a second conductor provided substantially parallel to one another along the length of the rail and being embedded in the elongated body such that they do not extend beyond the front surface,
wherein the elongated body comprises a front recess in the front surface, the front recess being at an upper side delimited by the top member;
(b) an electronic shelf label comprising:
a label body having a front side for displaying information, a rear side opposite to the front side and a top side at the top of the label body;
a lower hook member protruding from a lower portion of the rear side having an upwardly facing opening configured to receive a lower edge of a rail for holding the electronic shelf label; and a rear protrusion protruding from the top of the rear side having a closed upper side substantially flush with an upper side of the label body; and (c) a controller module including a housing for housing control electronics configured to control the electronic shelf label; and (d) a controller connector comprising a protrusion protruding from the controller module and being wider at a distance from the controller module, the protrusion comprising at least a first controller electrode and a second controller electrode, the controller connector arranged to engage with a rear connector cavity of the rail.

17. An electronic shelf label system according to claim 16, further comprising an energy source for providing electrical energy to the controller module and the electronic shelf label via the rail.

* * * * *